United States Patent
Ujita et al.

(10) Patent No.: US 8,575,731 B2
(45) Date of Patent: Nov. 5, 2013

(54) SEMICONDUCTOR DEVICE WITH A BALUN

(75) Inventors: Shinji Ujita, Osaka (JP); Takeshi Fukuda, Osaka (JP); Hiroyuki Sakai, Kyoto (JP)

(73) Assignee: Panasonic Corporation, Osaka (JP)

( * ) Notice: Subject to any disclaimer, the term of this patent is extended or adjusted under 35 U.S.C. 154(b) by 71 days.

(21) Appl. No.: 12/999,472

(22) PCT Filed: Jun. 15, 2009

(86) PCT No.: PCT/JP2009/002697
§ 371 (c)(1),
(2), (4) Date: Dec. 16, 2010

(87) PCT Pub. No.: WO2009/153956
PCT Pub. Date: Dec. 23, 2009

(65) Prior Publication Data
US 2011/0089543 A1    Apr. 21, 2011

(30) Foreign Application Priority Data
Jun. 17, 2008 (JP) ................................. 2008-158340

(51) Int. Cl.
*H01L 23/58* (2006.01)
(52) U.S. Cl.
USPC ............. 257/664; 257/E23.002; 257/E21.02; 257/379; 257/528; 257/531; 333/26; 333/204; 333/238; 333/187
(58) Field of Classification Search
USPC .................. 257/664, E23.002, 379, 528, 531, 257/E21.02
See application file for complete search history.

(56) References Cited

U.S. PATENT DOCUMENTS

| | | | |
|---|---|---|---|
| 4,460,880 A | | 7/1984 | Turner |
| 5,025,232 A | * | 6/1991 | Pavio ............................. 333/26 |
| 5,095,357 A | | 3/1992 | Andoh et al. |
| 2003/0020568 A1 | * | 1/2003 | Mizutani et al. .............. 333/204 |
| 2004/0000964 A1 | | 1/2004 | Killen et al. |
| 2004/0041653 A1 | | 3/2004 | Tanabe et al. |
| 2006/0226930 A1 | | 10/2006 | Carvalho et al. |
| 2009/0079512 A1 | | 3/2009 | Fujiwara et al. |
| 2012/0086523 A1 | * | 4/2012 | Meltaus et al. ............... 333/187 |

FOREIGN PATENT DOCUMENTS

| | | |
|---|---|---|
| JP | 8-51307 | 2/1996 |
| JP | 9-205306 | 8/1997 |
| JP | 2003-78309 | 3/2003 |
| JP | 2003-87008 | 3/2003 |
| JP | 2004-32779 | 1/2004 |
| JP | 2004-274172 | 9/2004 |
| JP | 2007-6063 | 1/2007 |
| WO | 2007/086405 | 8/2007 |

OTHER PUBLICATIONS

International Search Report, dated Aug. 18, 2009.

* cited by examiner

*Primary Examiner* — Cathy N Lam
(74) *Attorney, Agent, or Firm* — McDermott Will & Emery LLP

(57) ABSTRACT

A semiconductor integrated circuit device with a balun which is formed above a conductive semiconductor substrate and which includes a dielectric film, an unbalanced line for transmitting an unbalanced signal, and balanced lines for transmitting a balanced signal. The unbalanced line is placed opposite to the balanced lines via a nano-composite film that is a region of the dielectric film. The nano-composite film, interposed between the unbalanced line and the balanced lines, has a relative permittivity higher than that of other regions of the dielectric film. This allows suppression of electromagnetic coupling of transmission lines or passive elements other than the balun, thereby providing a semiconductor device with a wide-band and small-size balun.

11 Claims, 7 Drawing Sheets

(A)

(B)

SEMICONDUCTOR DEVICE WITH A BALUN

TECHNICAL FIELD

The present invention relates to a semiconductor device with a balun miniaturized to be mounted on a Monolithic Microwave Integrated Circuit (MMIC) chip in a radio-frequency semiconductor device such as various types of communications apparatuses and radars.

BACKGROUND ART

A balun is used for converting an unbalanced signal, transmitting through an unbalanced transmission line, to a balanced signal, transmitting through a balanced transmission line and vice versa. The balun is also capable of performing impedance conversion. For example, in the case where an unbalanced signal is provided to an unbalanced terminal of the balun, a pair of balanced signals, having phases that are different by 180 degrees (reverse phase) and having the same amplitude, are output through a balanced terminal of the balun. Further, the balun may also be formed in inner interconnection layers within a semiconductor chip.

A balun that can be used for GHz is available which is fabricated by multilayer interconnect technology performed on a substrate.

FIGS. 7(A) to 7(C) show an example of a conventional balun. FIG. 7(A) is a plan view thereof, and FIGS. 7(B) and 7(C) are cross sectional views thereof taken at different angles. In FIGS. 7(A) to 7(C), X is the horizontal direction of the main surface of the substrate, Y is the longitudinal direction of the main surface of the substrate, and Z is the vertical direction relative to the main surface of the substrate.

A balun 61 includes a dielectric film 62, a ground interconnect film 63 partially formed on the surface of the dielectric film 62, a dielectric film 64 formed on the dielectric film 62 covering the ground interconnect film 63, and a balanced interconnect film 65 partially formed on the surface of the dielectric film 64. The balanced interconnect film 65 has an end 65a connected to a terminal Port 2, and an end 65b connected to a terminal Port 3.

The balun 61 further includes a dielectric film 66 formed on the dielectric film 64 covering the balanced interconnect film 65, and an unbalanced interconnect film 67 partially formed on the dielectric film 66. The unbalanced interconnect film 67 is placed opposite the balanced interconnect film 65 via the dielectric film 66, forming an electromagnetic coupling region 68.

The unbalanced interconnect film 67 has one end connected to a terminal Port 1 of the unbalanced line. The vicinity of the other end of the unbalanced interconnect film 67 is connected to the ground interconnect film 63 via a through hole (or a via hole) running through the third and second dielectric films 66 and 64.

With through holes (or via holes) 70 running through the dielectric film 66, the ends 65a and 65b of the balanced interconnect film 65 are connected to electrodes of an external capacitor 71.

With the balun 61 thus structured, a radio-frequency signal provided through the terminal Port 1 to the unbalanced interconnect film 67 is transmitted to the balanced interconnect film 65 by an electromagnetic coupling at the electromagnetic coupling region 68 where the unbalanced interconnect film 67 and the balanced interconnect film 65 are opposing each other. The transmitted radio-frequency signal is output through the terminals Port 2 and Port 3 of the balanced lines as balanced signals having 180 degrees phase shift.

In addition, with recent advance in miniaturization techniques, a radio-frequency circuit on a Si semiconductor substrate has been developed. However, there is a problem in that losses of passive elements, such as transmission lines or inductors, are large due to low resistance of the Si semiconductor substrate. In order to block the influences from the Si semiconductor substrate, a method is used which grounds interconnect layers below interconnect layers where the transmission lines and passive elements are formed.

In the case where the method is used for the balun, a common mode impedance Ze is small because the distance between the interconnect layers forming the balun and the ground is short. Thus, Ze/Zo that is the ratio of the common mode impedance Ze to differential impedance Zo is small. This is not preferable in a sense that a greater value of Ze/Zo is required to increase the bandwidth of the balun.

It is possible to increase the value of Ze/Zo by decreasing the differential impedance Zo between the unbalanced line and the balanced lines of the balun. In the case where the unbalanced line and the balanced lines of the balun are placed on the same plane, the space between the unbalanced line and the balanced lines are determined depending on the degree of precision of the lithography technique which forms interconnections. Thus, it is not possible to sufficiently narrow the space to an adjacent interconnect film, thereby imposing limitations in decreasing the differential impedance Zo.

The balun of the conventional example shown in FIGS. 7(A) to 7(C) is useful to overcome the limitations. More specifically, by forming the unbalanced interconnect film 67 and the balanced interconnect film 65 via the dielectric film 66 in the stacking direction, it is possible to narrow the space between the unbalanced interconnect film 67 and the balanced interconnect film 65 more than the case where the balun is formed on the same plane. Therefore, by increasing the degree of electromagnetic coupling of the unbalanced interconnect film 67 and the balanced interconnect film 65, the differential impedance Zo can be decreased, thereby increasing the bandwidth of the balun.

CITATION LIST

Patent Literature

PTL [1]
Japanese Unexamined Patent Application Publication No. 2004-274172

SUMMARY OF INVENTION

Technical Problem

In the balun shown in FIG. 7, it is possible to decrease the differential impedance Zo by placing the unbalanced interconnect film 67 and the balanced interconnect film 65 via the dielectric film 66 in the stacking direction so as to thin the dielectric film 66 and increase the electromagnetic coupling of the unbalanced interconnect film 67 and the balanced interconnect film 65.

However, in the case where lines, such as transmission lines and passive elements other than the balun, are formed in different interconnect layers via the dielectric film 66, thinning the dielectric film 66 results in an increase in the electromagnetic coupling between those lines. This adversely affects the characteristics of the lines. Thus, the dielectric film 66 cannot be thinned simply for improving the characteristics of the balun, and the flexibility of the design in balun cannot be achieved.

In view of the problems, the present invention has an object to provide a semiconductor device having a wide-band and small-size balun. In the semiconductor device, Ze/Zo that is the ratio of the common mode impedance Ze to the differential impedance Zo can be increased by increasing only the electromagnetic coupling of the unbalanced line and the balanced lines of the balun without adversely affecting the electromagnetic coupling of the interconnections other than the balun formed in different interconnect layers.

Solution to Problem

In order to solve the problems, the semiconductor device according to an aspect of the present invention includes: a substrate; and a balun including a dielectric film, an unbalanced line for transmitting an unbalanced signal, and a pair of balanced lines for transmitting a balanced signal, the balun being formed above the substrate, wherein the unbalanced line is placed opposite to the pair of balanced lines via a region of the dielectric film, and in the dielectric film, at least the region interposed between the unbalanced line and the pair of balanced lines has a relative permittivity higher than a relative permittivity of other regions.

Further, in the semiconductor device, it may be that the unbalanced line, the dielectric film, and the pair of balanced lines are stacked above the substrate. Furthermore, it may be that the unbalanced line and the pair of balanced lines are formed in a single interconnect layer, and the dielectric film is filled in between the unbalanced line and the pair of balanced lines With the structure, the balun according to an aspect of the present invention is capable of increasing the electromagnetic coupling between the unbalanced line and the balanced lines and decreasing the differential impedance Zo without thinning the dielectric film between the unbalanced line and the balanced lines, by partially forming a dielectric film with a high relative permittivity at least between the unbalanced line and the balanced lines in the balun forming region. As described, the dielectric film having a high relative permittivity is partially formed at least in the balun forming area. As a result, the electromagnetic coupling between the interconnections other than the balun does not increase.

In addition, due to the high relative permittivity of a high dielectric film, it is possible to reduce the length of the lines forming the balun, allowing the downsizing of the balun.

It may be that the semiconductor device further includes a ground electrode film between (i) the substrate, and (ii) the unbalanced line and the pair of balanced lines. It also may be that the semiconductor device further includes another ground electrode film positioned on a side of the balanced line and the pair of balanced lines, the side being a farther side from the substrate.

Further, in the semiconductor device, it may be that the dielectric film, the unbalanced line, and the pair of balanced lines are formed, by a post-passivation interconnection process, above the substrate on which a main circuit including a predetermined circuit element is formed in advance through a main process.

Further, in the semiconductor device, it may be that in the dielectric film, at least the region interposed between the unbalanced line and the pair of balanced lines is formed of a nano-composite film in which particles of a first material are dispersed in a second material.

Further, it may be that the dielectric film is formed of the second material, and the first material is dispersed in the region, interposed at least between the unbalanced line and the pair of balanced lines, of the dielectric film so that the region is reformed to the nano-composite film.

Here, it is preferable that the first material has a particle diameter ranging from 1 nm to 200 nm. Further, the first material may be ceramics. In this case, the ceramics may be one of strontium titanate and barium strontium titanate.

Further, it may be that the second material is one of benzocyclobutene, polyimide, polytetrafluoroethylene, and polyphenylene oxide.

Advantageous Effects of Invention

According to the present invention, it is possible to provide a semiconductor device having a wide-band and small-size balun. In the semiconductor device, only the electromagnetic coupling between the unbalanced line and the balanced lines of the balun can be increased without increasing the electromagnetic coupling between the lines other than the balun formed in different interconnect layers.

BRIEF DESCRIPTION OF DRAWINGS

FIG. 1 is a cross-sectional view showing an example of a structure of a balun according to an embodiment of the present invention.
FIG. 2 is a circuit diagram showing a circuit structure of the balun according to an embodiment of the present invention.
FIG. 3(A) is a graph showing length of a balanced line and bandwidth of the balun relative to relative permittivity of a dielectric film in the balun according to the embodiment of the present invention.
FIG. 3(B) is a graph showing frequency characteristics relative to the relative permittivity of the dielectric film in the balun according to the embodiment of the present invention.
FIG. 4 is a circuit diagram showing another circuit structure of the balun according to the embodiment of the present invention.
FIG. 6 is a cross sectional view showing an example of a structure of a semiconductor integrated circuit device including a balun formed by a post-passivation interconnection process.

DESCRIPTION OF EMBODIMENT

Hereinafter, an embodiment of the present invention is described with reference to the drawings.

Figure 1:
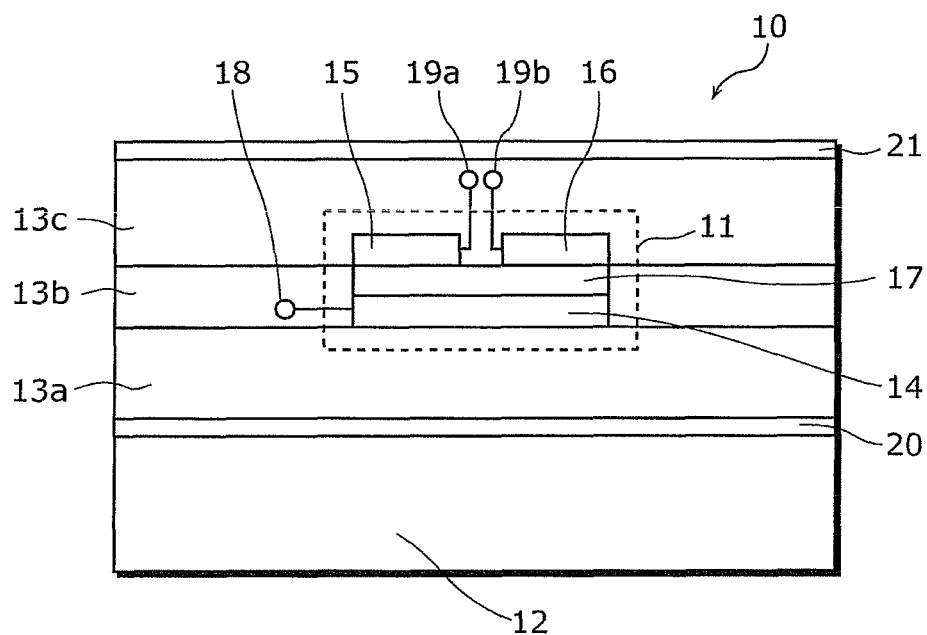
[FIG. 1]

FIG. 1 is a cross sectional view showing an example of a structure of a semiconductor integrated circuit device 10 including a balun 11 according to the embodiment of the present invention.

Figure 2:
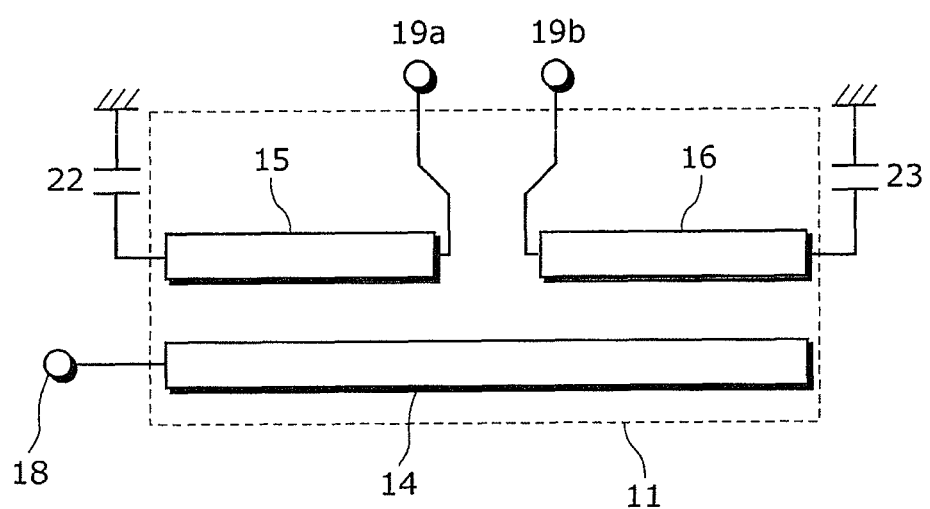
[FIG. 2]

FIG. 2 is a circuit diagram showing a circuit structure of the balun 11 shown in FIG. 1.

The semiconductor integrated circuit device 10 shown in FIG. 1 includes: the balun 11, a semiconductor substrate 12, dielectric films 13a, 13b, and 13c, an unbalanced line 14 for transmitting an unbalanced signal, balanced lines 15 and 16 for transmitting a balanced signal, a nano-composite film (a high dielectric film) 17, an unbalanced signal input (output) terminal 18, balanced signal output (input) terminals 19a and 19b, and ground electrode films 20 and 21.

Above the semiconductor substrate 12, dielectric layers where dielectric films are provided and interconnect layers where interconnect films are provided are alternately defined in the stacking direction. The unbalanced line 14 and the balanced lines 15 and 16 that are the interconnect layers are formed in different interconnect layers that are positioned on both sides of the dielectric film 13b.

The dielectric film 13b positioned between the unbalanced line 14 and the balanced lines 15 and 16 is partially formed at least at the forming region of the balun 11, with the nano-composite film 17 having a relative permittivity higher than other regions. Here, the forming region of the balun 11 refers to a region, of the dielectric film 13b, interposed between the unbalanced line 14 and the balanced lines 15 and 16. Further, at least at the forming region of the balun 11 refers to part of the dielectric film 13b and a region which completely includes the portion interposed between the unbalanced line 14 and the balanced lines 15 and 16.

The ground electrode films 20 and 21 each has an area larger than at least the area of the balun 11 including the unbalanced line 14 and the balanced lines 15 and 16.

The unbalanced line 14 is placed in parallel with and opposing the balanced lines 15 and 16 in the stacking direction. The unbalanced line 14 has one end connected to the unbalanced signal output (output) terminal 18 and the other end that is opened. The balanced line 15 has one end connected to the balanced signal output (input) terminal 19a, and the other end grounded via the capacitor 22. The balanced line 16 has one end connected to the balanced signal output (input) terminal 19b, and the other end grounded via the capacitor 23. The capacitors 22 and 23 provide impedance matching with ground.

The capacitors 22 and 23 are formed using, for example, an MIM (metal, insulating film, metal) capacitive element, in the semiconductor integrated circuit device 10. In FIG. 1, the capacitors 22 and 23 are not shown.

The balun 11 according to the present embodiment uses the nano-composite film 17. Here, the nano-composite film refers to a film made of a material where microscopic particles of a first material having a high relative permittivity are dispersed in a second material having a low relative permittivity and low dielectric loss. In the present embodiment, an example case is described where strontium titanate (STO) is used as the first material and benzocyclobutene (BCB) is used as the second material. The relative permittivity of the nano-composite film can be adjusted by the relative permittivity of the microscopic particles dispersed in the BCB film and dispersed amount thereof. Thus, the relative permittivity can be flexibly set in the range from a few dozen to a few thousand.

Furthermore, the base of the nano-composite film is a BCB film; and thus, it is possible to easily form the nano-composite film using spin coating, similar to the BCB film. Thus, it is possible to use the conventional fabrication process without modification. Further, the nano-composite film is formed by dispersing the STO in the BCB film; and thus, it is possible to selectively form the nano-composite film at a certain region.

More specifically, it is possible to reform part of the dielectric film 13b to the nano-composite film 17 by forming the dielectric film 13b from BCB and selectively dispersing the STO at least at the forming region of the balun 11 in the dielectric film 13b. The expression used in the following that the nano-composite film 17 is introduced to the dielectric film 13b includes reforming the dielectric film 13b to the nano-composite film 17.

By partially forming at least the forming region of the balun 11 of the dielectric film 13b with the nano-composite film 17 having a high relative permittivity, it is possible to increase the electromagnetic coupling between the unbalanced line 14 and the balanced lines 15 and 16 without thinning the dielectric film 13b and to decrease the differential impedance Zo.

Further, the relative permittivity of the BCB lower than the relative permittivity of the nano-composite film 17 is maintained in other regions of the dielectric film 13b which are not reformed to the nano-composite film 17; and thus, interconnections other than the balun can be flexibly formed.

By increasing Ze/Zo, it is possible to increase the bandwidth of the balun. In addition, by using the nano-composite film 17 having a high relative permittivity, the interconnect length of the balun can be reduced. This allows downsizing of the balun. Furthermore, it is not necessary to thin the dielectric film 13b; and thus, it is possible to prevent increase in the electromagnetic coupling between the interconnections that are other than the balun and are present in the interconnect layers at both sides of the dielectric film 13b.

The balun according to the present embodiment is, for example, designed for transmitting a signal of 26 GHz.

Figure 3:
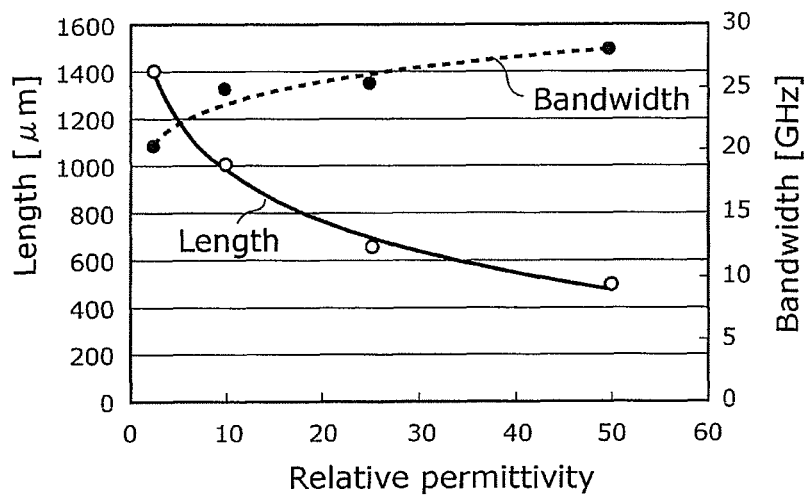
[FIG. 3]
Figure 3:
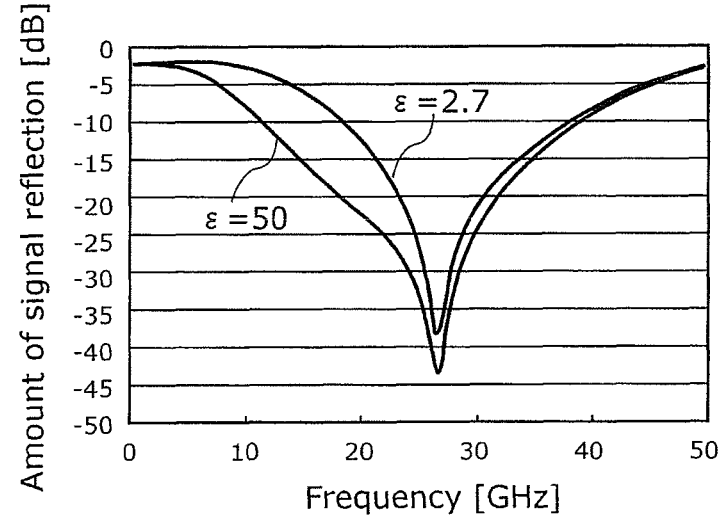

FIG. 3(A) is a graph showing the length [μm] of the balanced lines 15 and 16 of the balun 11 and bandwidth [GHz] of the balun 11 for the case where no nano-composite film 17 is introduced to the dielectric film 13b and for the cases where the nano-composite film 17 having the relative permittivity $\in$ of 10, 25 and 50 are introduced to the dielectric film 13b.

In FIG. 3(A), the length of the balanced lines 15 and 16 are indicated by white dots and a solid line. The bandwidth of the balun 11 is indicated by black dots and a dashed line.

The length of the balanced lines 15 and 16 depend on the input impedance Zin (admittance Yin), the output impedance Zout (admittance Yout), the common mode impedance Zoe (admittance Yoe) and the differential impedance Zoo (admittance Yoo) of the balun. The dependent equations are as follows.

[Equation 1]

$$\frac{(-Yoe + Yoo)^2 Yout}{Yin} - \qquad (A)$$
$$8\left(Yout^2 + \left(-2\omega c1 + \frac{1}{2}(Yoe + Yoo)\text{Cot}[\theta]\right)^2\right)\text{Sin}[\theta]^2 = 0$$

$$4\left(-\frac{2Yin\omega c1}{Yout} + \omega c2\right) + (Yoe + Yoo)\left(\left(-1 + \frac{2Yin}{Yout}\right)\text{Cot}[\theta] + \text{Tan}[\theta]\right) = 0 \qquad (B)$$

By solving the equations (A) and (B), the length of the balanced lines 15 and 16 can be obtained. In the equations, θ denotes electrical length. The length of the balanced lines 15 and 16 can be obtained by the equation of $L=(\lambda_0/\sqrt{\in})\times(\theta/2\pi)$. $\lambda_0$ denotes the wavelength for 26 GHz that is the frequency of the signal to be transmitted, and $\in$ denotes the relative permittivity derived in consideration with all the dielectric films (the dielectric film 13a, 13b, and 13c, the nano-composite film 17 and the like) related to the electromagnetic coupling of the unbalanced line and the balanced lines. In the present embodiment, ωc1 and ωc2 in the equations are set to 0.

The relative permittivity of the dielectric film 13b when no nano-composite film 17 is introduced is 2.7 that is the relative permittivity of the BCB film. It is assumed that the cross-section structure of the balun 11 is the same no matter what the relative permittivity of the nano-composite film 17 is.

As shown in the graph, according to the balun 11 of the present embodiment, the length of each of the balanced lines 15 and 16 is 1400 μm and the bandwidth is 20.3 GHz when no nano-composite film 17 is introduced. However, when the nano-composite 17 having the relative permittivity $\in$ of 50 is introduced, the length of each of the balanced lines 15 and 16 is 490 μm and the bandwidth is 27.9 GHz, showing improvements.

FIG. 3(B) is a graph showing frequency dependence of the amount of signal reflection [dB] of the case where the BCB film having the relative permittivity $\in$ of 2.7 is used without introducing the nano-composite film 17 and the case where the nano-composite film 17 having the relative permittivity $\in$ of 50 is introduced. The graph shows that introduction of the nano-composite film 17 having the relative permittivity $\in$ of 50 reduces the amount of the signal reflection, so that transmission characteristics are wide-banded.

Figure 4:
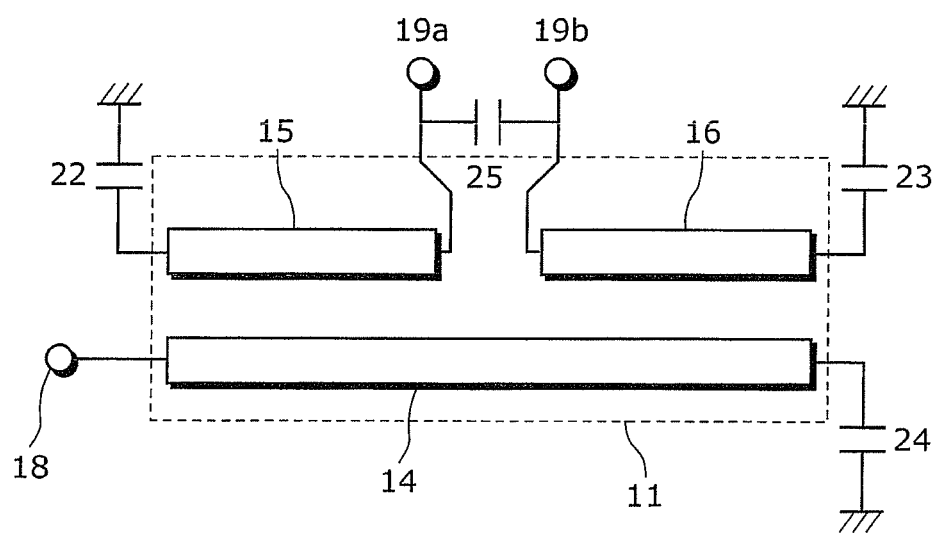
[FIG. 4]

FIG. 4 is a circuit diagram showing a circuit structure of the balun according to the present embodiment. The balanced signal output (input) terminal 19a and the balanced signal output (input) terminal 19b are connected via the capacitor 25. Further, an end of the unbalanced line 14, which is different from the unbalanced signal input (output) terminal 18, is grounded via the capacitor 24. It is possible to further downsize the balun by substituting the capacitance parameter $\omega c1$ of the capacitor 25 to the equations (A) and (B). The balun according to the present embodiment may have such a circuit structure.

Figure 5:
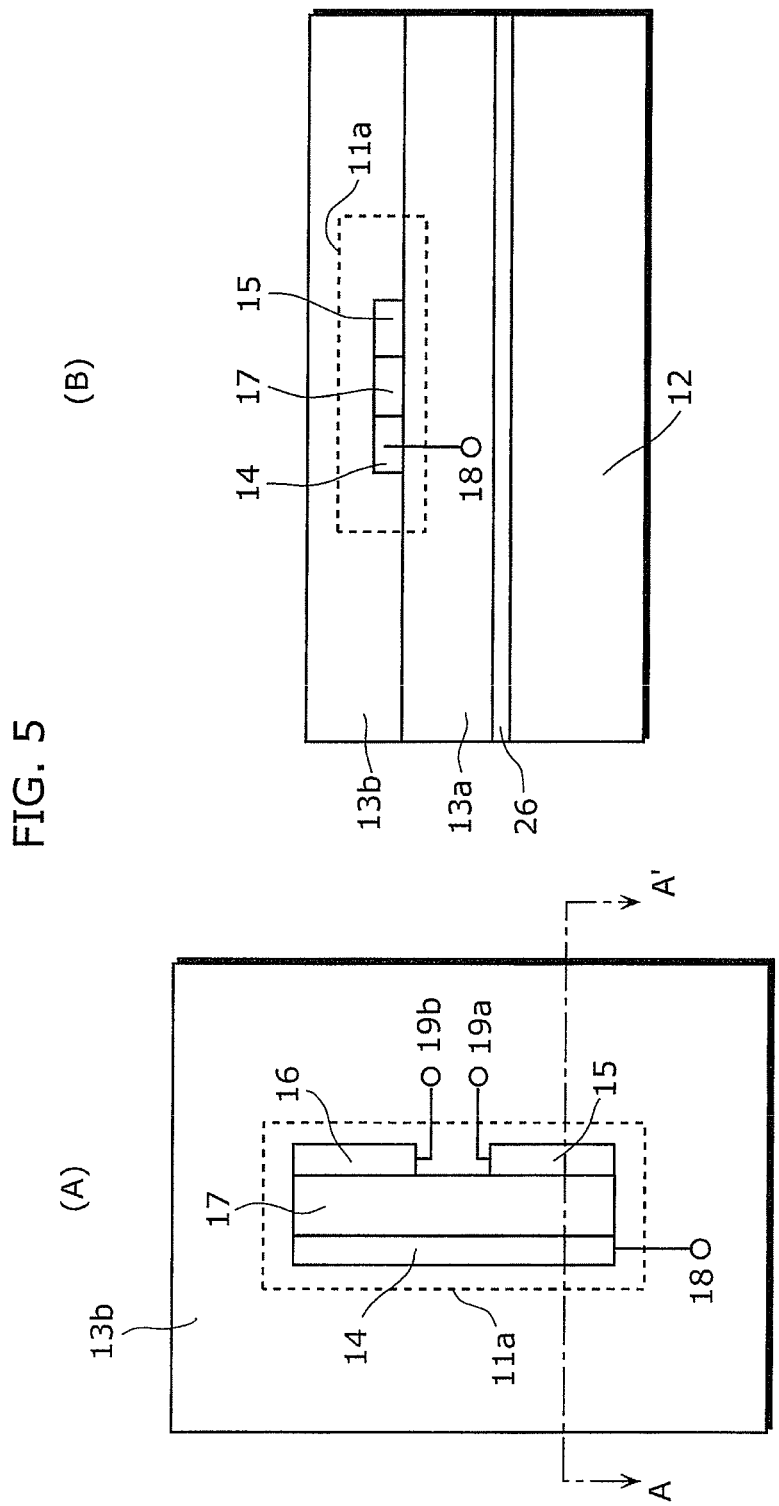
[FIG. 5]
FIGS. 5(A) and (B) are a plan view and a cross sectional view of an example of a structure of a balun according to a variation of the present invention.

FIGS. 5(A) and 5(B) are diagrams showing an example of a structure of a balun 11a according a variation of the present invention. FIG. 5(A) is a plan view of the balun 11a, and FIG. 5(B) is a cross section view taken along A to A' of the balun 11a. Like referential numerals are used in FIGS. 5(A) and 5(B) to indicate like elements as in FIG. 1 so that the descriptions of the like elements are omitted.

Above the semiconductor substrate 12, the dielectric film 13a is formed. On the dielectric film 13a, the unbalanced line 14 and the balanced lines 15 and 16 are arranged in the same interconnect layer. In the dielectric film 13b, at least the region between the unbalanced line 14 and the balanced lines 15 and 16 is partially formed with the nano-composite film 17. This increases the electromagnetic coupling between the unbalanced line 14 and the balanced lines 15 and 16, and decreases the differential impedance Zo.

The ground electrode film 26 is formed in the interconnect layer between the semiconductor substrate 12 and the dielectric film 13a so as to block the influences from the semiconductor substrate 12. The ground electrode film 26 has an area larger than at least the area of the balun 11a including the unbalanced line 14 and the balanced lines 15 and 16 formed on the same plane.

The balun 11a has the same circuit structure as in FIG. 2 and FIG. 4. The unbalanced line 14 has one end connected to the unbalanced signal input (output) terminal 18 and the other end opened. The balanced line 15 has one end connected to the balanced signal output (input) terminal 19a, and the other end grounded via the capacitor 22. The balanced line 16 has one end connected to the balanced signal output (input) terminal 19b, and the other end grounded via the capacitor 23. In FIGS. 5(A) and 5(B), the capacitors 22 and 23 are not shown.

The dielectric film 13b is formed on the interconnect layer where the unbalanced line 14 and the balanced lines 15 and 16 are arranged.

It has been described in the "Problems that Invention is to solve" section that the space between the unbalanced line 14 and the balanced lines 15 and 16 are determined depending on the lithography technique so that the space cannot be sufficiently narrowed in the structure of the balun 11a where the unbalanced line 14 and the balanced lines 15 and 16 are arranged in the same interconnect layer. Thus, in conventional techniques, there is a limit in decreasing the differential impedance Zo between the unbalanced line 14 and the balanced lines 15 and 16.

However, in the structure of the balun 11a, by forming the nano-composite film 17 between the unbalanced line 14 and the balanced lines 15 and 16, the electromagnetic coupling can be increased without narrowing the space between the unbalanced line 14 and the balanced lines 15 and 16 and the value of the differential impedance Zo can be reduced than before. As a result, it is possible to increase the bandwidth of the balun and downsize the balun.

The balun according to the present invention has been described based on the embodiment; however, the present invention is not limited to the embodiment. Those skilled in the art will readily appreciate that many modifications are possible in the present embodiment without materially departing from the novel teaching and advantages of this invention. Accordingly, all such modifications are intended to be included within the scope of this invention.

For example, it may be that the balun according to the present embodiment may be formed by a post-passivation interconnection process that is performed after the main process in the fabrication of the semiconductor integrated circuit device.

Figure 6:
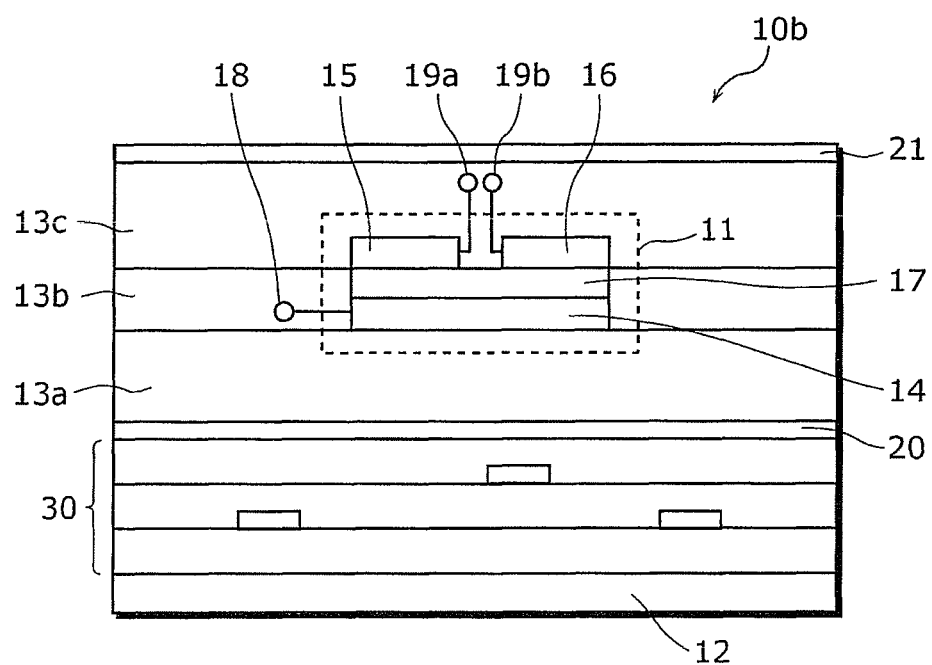
[FIG. 6]
Figure 7:
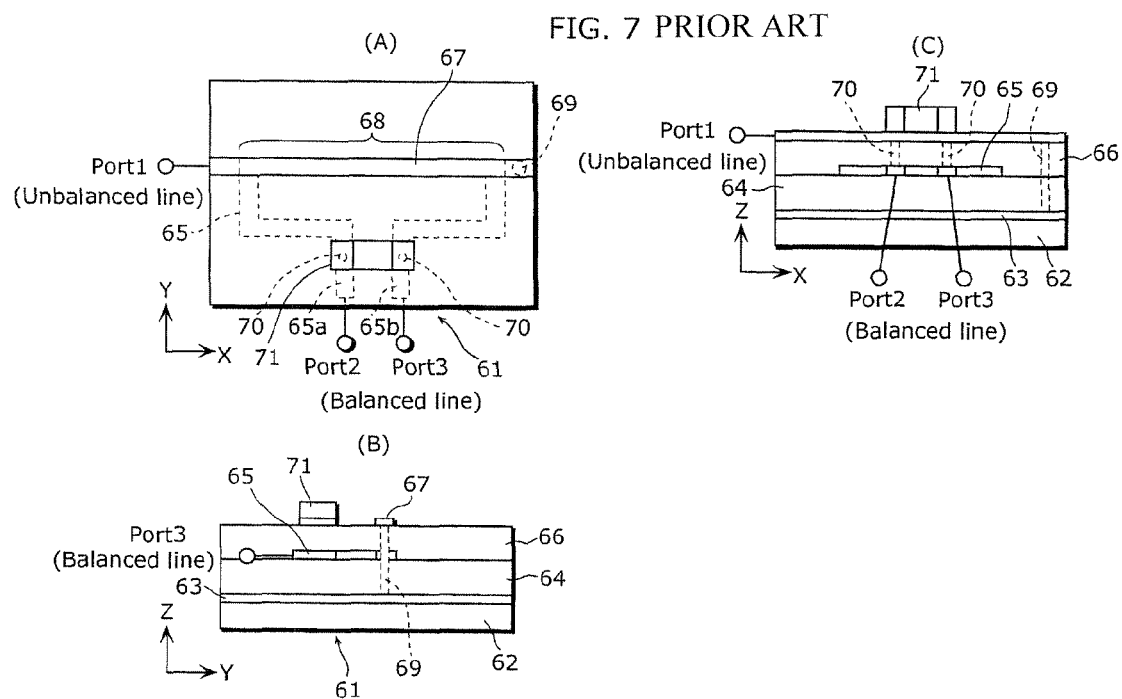
[FIG. 7]
FIGS. 7(A), (B) and (C) are a plan view showing an example of a conventional balun structure and cross sectional views thereof taken from two directions.

FIG. 6 is a cross sectional view showing an example of a structure of a semiconductor integrated circuit device 10b including the balun 11 formed by a post-passivation interconnection process.

The semiconductor integrated circuit device 10b is fabricated by forming, in advance, the main circuit 30 including predetermined circuit elements on the semiconductor substrate 12 by the main process, and then forming, by the post-passivation interconnection process, the structure above the ground electrode film 20 including the balun 11, shown in e.g. FIG. 1.

In the semiconductor integrated circuit device 10b thus structured, flexibility in the designing of the balun is improved by placing the main circuit 30 and the balun 11 so as to be layered in the stacking direction. It also allows the downsizing of the entire semiconductor integrated circuit device.

In the balun 11 shown in FIG. 1 and FIG. 6, the unbalanced line 14 is placed closer to the semiconductor substrate 12 than the balanced lines 15 and 16; however, it may be that the unbalanced line 14 is placed farther to the semiconductor substrate 12 than the balanced lines 15 and 16.

Further, it is preferable for the balun according to the present embodiment that the semiconductor substrate 12 is a conductive substrate such as a silicon.

In the balun according to the present embodiment, it may be that the unbalanced line 14 and the balanced lines 15 and 16 forming the balun are microstrip lines or coplanar lines.

In the balun according to the present embodiment, the lines forming the balun may be in a spiral form or a meander form.

Further, STO is used as a first material for the nano-composite film in the present embodiment; however, any materials may be used for the first material as long as they have a high relative permittivity and they can be processed into microscopic particles. For example, barium strontium titanate (BST) or barium titanate (BTOZ) may be used. Another example is ceramics having a relative permittivity of a few dozen to a few hundred. Further, multiple materials having different relative permittivity may be used.

It is sufficient that the first material has a particle diameter that can be kneaded and dispersed in the second material. The smaller particle diameter is preferable. In particular, it is preferable that the particle diameter is equal to or less than 1 μm, and the range approximately between 1 nm to 200 nm is particularly suitable for obtaining preferred characteristics.

Further, the concentration of the first material may be selected depending on the required relative permittivity. For example, in the case of the combination of STO and BCB, the concentration of the first material can be increased up to approximately 90%.

It is sufficient that the second material is a material having a low relative permittivity and low dielectric loss. Instead of the BCB, polyimide, polytetrafluoroethylene, polyphenylene oxide or the like may be used.

INDUSTRIAL APPLICABILITY

With the balun according to an aspect of the present invention, it is possible to achieve wide-band and small MMIC, and the balun can be used in a radar system or a wireless communications system in a microwave band, quasi-millimeter band, or millimeter wave band.

REFERENCE SIGNS LIST 10, 10b Semiconductor integrated circuit device
11, 11a Balun
12 Semiconductor substrate
13a, 13b, and 13c Dielectric film
14 Unbalanced line
15, 16 Balanced line
17 Nano-composite film
18 Unbalanced signal input (output) terminal
19a, 19b Balanced signal output (input) terminal
20, 21, 26 Ground electrode film
22 to 25 Capacitor
30 Main circuit
61 Balun
62, 64, and 66 Dielectric film
63 Ground interconnect film
65 Balanced interconnect film
65a, 65b End
67 Unbalanced interconnect film
68 Electromagnetic coupling region
69, 70 Through-hole
71 External capacitor

The invention claimed is:

1. A semiconductor device comprising:
a substrate; and
a balun including a dielectric film, an unbalanced line for transmitting an unbalanced signal, and a pair of balanced lines for transmitting a balanced signal, said balun being formed above said substrate,
wherein said unbalanced line is placed opposite to said pair of balanced lines via a region of said dielectric film, and
in said dielectric film, at least the region interposed between said unbalanced line and said pair of balanced lines is formed of a nano-composite film in which particles of a first material are dispersed in a second material, and the region has a relative permittivity higher than a relative permittivity of other regions.

2. The semiconductor device according to claim 1,
wherein said unbalanced line, said dielectric film, and said pair of balanced lines are stacked above said substrate.

3. The semiconductor device according to claim 1,
wherein said unbalanced line and said pair of balanced lines are formed in a single interconnect layer, and
said dielectric film is filled in between said unbalanced line and said pair of balanced lines.

4. The semiconductor device according to claim 1, further comprising
a ground electrode film between (i) said substrate, and (ii) said unbalanced line and said pair of balanced lines.

5. The semiconductor device according to claim 1, further comprising
another ground electrode film positioned on a side of said balanced line and said pair of balanced lines, the side being a farther side from said substrate.

6. The semiconductor device according to claim 1,
wherein said dielectric film, said unbalanced line, and said pair of balanced lines are formed, by a post-passivation interconnection process, above said substrate on which a main circuit including a predetermined circuit element is formed in advance by a main process.

7. The semiconductor device according to claim 1, wherein the first material has a particle diameter ranging from 1 nm to 200 nm.

8. The semiconductor device according to claim 7,
wherein the first material is ceramics.

9. The semiconductor device according to claim 8,
wherein the ceramics is one of strontium titanate and barium strontium titanate.

10. The semiconductor device according to claim 1,
wherein the second material is one of benzocyclobutene, polyimide, polytetrafluoroethylene, and polyphenylne oxide.

11. The semiconductor device according to claim 1,
wherein said dielectric film is formed of the second material, and
the first material is dispersed in the region, interposed at least between said unbalanced line and said pair of balanced lines, of said dielectric film so that the region is reformed to the nano-composite film.

* * * * *